(12) United States Patent
Choi

(10) Patent No.: US 6,410,917 B1
(45) Date of Patent: Jun. 25, 2002

(54) POLARIZATION-SENSITIVE CORRUGATED QUANTUM WELL INFRARED PHOTODETECTOR ARRAY

(75) Inventor: Kwong-Kit Choi, Brookeville, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 56 days.

(21) Appl. No.: 09/677,651

(22) Filed: Oct. 3, 2000

Related U.S. Application Data

(60) Provisional application No. 60/176,539, filed on Jan. 18, 2000.

(51) Int. Cl.[7] .................................................. G01J 5/20
(52) U.S. Cl. ................................. 250/338.4; 250/338.1
(58) Field of Search ........................... 250/338.4, 338.1

(56) References Cited

U.S. PATENT DOCUMENTS

| | | | |
|---|---|---|---|
| 5,485,015 A | | 1/1996 | Choi ............................ 257/21 |
| 5,552,603 A | * | 9/1996 | Stokes ....................... 250/338.4 |
| 6,133,571 A | * | 10/2000 | Dodd ........................ 250/338.4 |

OTHER PUBLICATIONS

Choi et al., "The Physics of Quantum Well Infrared Photodetectors," *World Scientific*, River Edge NJ, pp. 189–199, (1997).

* cited by examiner

Primary Examiner—Scott J. Sugarman
Assistant Examiner—Mohammed Hasan
(74) Attorney, Agent, or Firm—Paul S. Clohan, Jr.

(57) ABSTRACT

A polarization-sensitive infrared (IR) detector array for use in infrared cameras and other IR based instruments, is comprised of multiple corrugated quantum well infrared photodetector elements (C-QWIP) that form a unitary detector unit (cell). The array is preferably two-dimensional, which can detect polarization contrast of an observed object in a scene. Each detector unit (cell) is formed by a group of C-QWIP detector elements having different groove orientations and cross sections. Each detector unit (cell) has at least two C-QWIP detector elements with their respective corrugations orthogonally oriented. Infrared detection by these detector cells is primarily by polarization contrast, compared to intensity contrast, which is well known in the art. By measuring polarization of reflected light from the observed object, the type of material can also be identified. A first array embodiment of the invention comprises four C-QWIP elements that form a cell. The second array embodiment of the invention comprises a detector having two C-QWIPs to form a detector cell.

20 Claims, 11 Drawing Sheets

ELECTRIC FIELD DIRECTION RECORDED AS A FUNCTION OF TIME FOR NATURAL OCCURING LIGHT

UNPOLARIZED LIGHT DIRECTION IS RANDOM BUT MAGNITUDE IS THE SAME

POLARIZED LIGHT BOTH DIRECTION AND MAGNITUDE ARE FIXED

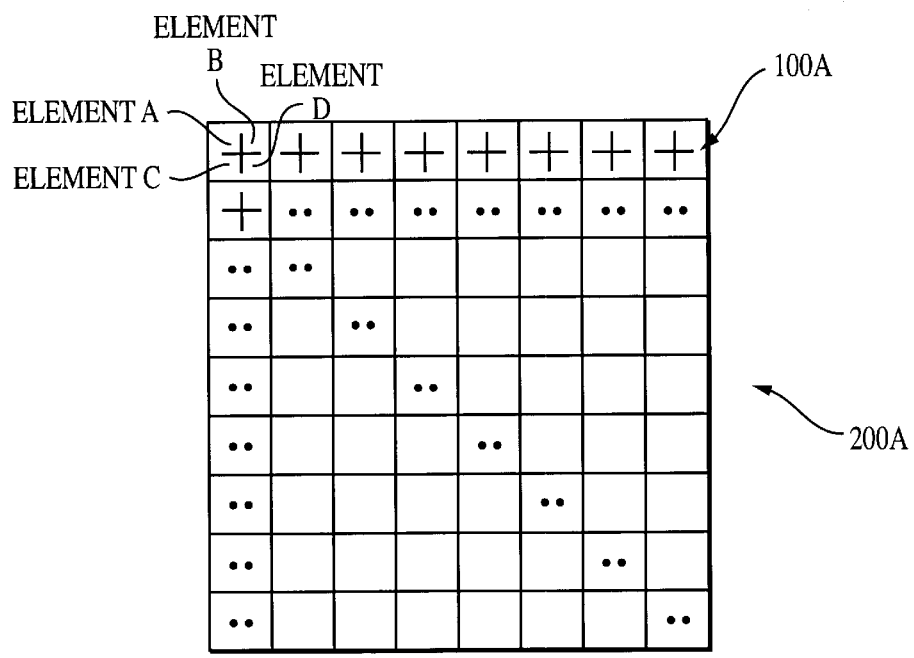
FIG. 5
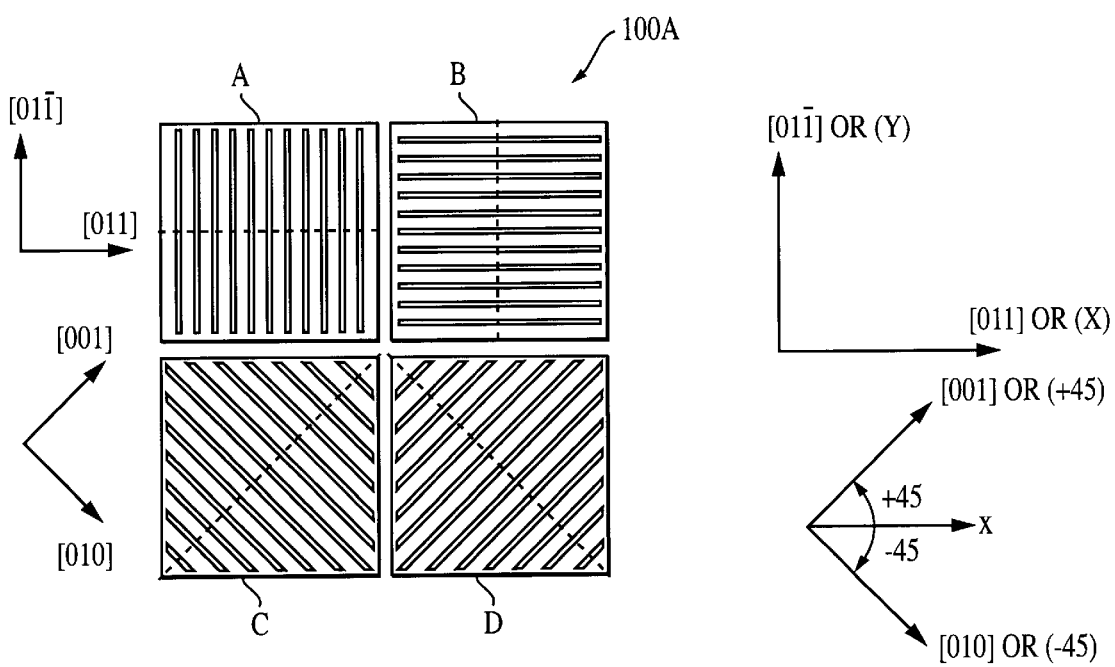
FIG. 6a
FIG. 6b

POLARIZATION-SENSITIVE CORRUGATED QUANTUM WELL INFRARED PHOTODETECTOR ARRAY

CROSS-REFERENCE TO RELATED APPLICATIONS

This application claims priority from U.S. Provisional Application S.N. 60/176,539 filed on Jan. 18, 2000.

U.S. GOVERNMENT INTEREST

The invention described herein may be manufactured, used, and licensed by or for the U.S. Government for Governmental purposes.

FIELD OF THE INVENTION

The invention relates in general to infrared image detection. More particularly, the invention relates to a polarization-sensitive infrared detection array using corrugated quantum well infrared photodetectors (C-QWIP) constructed to enable polarization-state detection of observed infrared radiation from a target object.

DESCRIPTION OF THE PRIOR ART

A quantum well infrared photodetector (QWIP) is a superlattice semiconductor device that functions to produce intersubband transitions within a conduction band when a ground state electron is promoted to an excited state upon absorbing an incoming photon having energy equal to the subband spacing. Once in an excited state, the electron freely moves within the QWIP to form electrical current under bias. As such, QWIPs are often used to detect infrared (IR) radiation, QWIP arrays have been used to detect IR images.

The physical construction of a conventional QWIP generally includes a stack of alternate semiconductor material layers sandwiched between two contact layers. The layers are grown on an IR transparent semiconductor substrate and cover an area that is relatively broad in comparison to the layer thickness. A typical semiconductor material system suitable for QWIP fabrication is $In_yGa_{1-y}As/Al_xGa_{1-x}As$. In a conventional QWIP device of the type described, intersubband transition can be initiated only if a component of the electric field vector of the incident IR radiation is normal to the broad surface areas of the semiconductor layers in the stack. Consequently, IR radiation that is incident normal to the semiconductor layers cannot be absorbed by the QWIP. Because only IR radiation having components propagated parallel to the semiconductor layers can be absorbed by the detector, attempts have been made to provide structures that can redirect the incident IR radiation closer to the desired parallel direction.

One known technique for redirecting IR radiation in a QWIP uses grating coupling techniques. The efficiency of a grating coupled with a QWIP is discussed in the following published article: Lundqvist et al., "Efficiency of grating coupled AlGaAs/GaAs quantum well infrared detectors," *Applied Physics Letters*, vol. 63 (24), Dec. 13, 1993, pp 3361–3363.

Another technique for coupling light uses corrugated structures in the form of linear grooves that are chemically etched into active volume of the QWIP. Depending on alignment of these grooves with a certain crystallographic direction, grooves with different angled sidewalls can be formed. For example, grooves along a [011] direction have a V-shaped profile, while those along an orthogonal [011] direction have an inverted V-shaped profile. Likewise, the sidewalls of the grooves along either [001] and [010] are vertical. These corrugated structures redirect the normal incident light from the substrate side into more parallel propagation. For the V-grooves, the light is redirected at the angled sidewall through reflection. For the inverted V-grooves, it is by refraction. For the vertical sidewalls, it is by diffraction.

A detailed description of light coupling using a corrugated QWIP (C-QWIP) structure is taught in U.S. Pat. No. 5,485,015 by my previous invention entitled "Quantum Grid Infrared Photodetectors," and an article by me, entitled "The Physics of Quantum Well Infrared Photodetectors," (World Scientific, River Edge, N.J., 1997) pp. 189–199. In these teachings, detection is primarily concerned with intensity measurements of the radiation. However, the use of grating coupling or corrugation coupling to detect polarization characteristics of incident infrared radiation is not suggested or taught by these teachings. The additional polarization information inherent in the observed infrared radiation has important details as to the surface properties of an observed target object. The detection and characterization of the object can be based on the difference in the state of polarization of the radiation from that object relative to a background scene. Such a problem is resolved by the present invention.

Corrugated quantum well infrared photo-detector (C-QWIP) arrays are sensitive and have high-resolution thermal imaging capabilities. These arrays are typically made out of low cost type III–V semiconductor materials and are easily manufactured in large quantities. They are suitable for a wide range of conventional applications as well as offering new imaging capabilities. C-QWIP arrays can be produced by a small number of conventional processing steps. They can be applied to most conventional applications, such as night vision, missile tracking and guidance, air and land traffic safety, environmental protection, natural resources exploration, meteorology, medical imaging, infrared astronomy, quality control, and robotic vision.

Areas where polarization-sensitive detection technology has been studied and investigated have used conventional technologies. Most of this study has been related to land-mine detection. Polarization-sensitive cameras have been discussed in the following articles that include: (1) Blair A. et al.,"Passive IR polarization sensors: a new technology for mine detection," SPIE Vol. 3392 (April 1998), pp 96–103; (2) Larive M. et al. "Laid and flush-buried mines detection using 8–12 micrometer polarimetric imager," SPIE Vol. 3392 (April 1998), pp.115–120. In these studies, the IR cameras are not intrinsically polarization sensitive (i.e. these cameras differentiate different levels of intensity, not polarization-state of the observed radiation). For polarization detection, both of these teachings use a set of optical elements, such as filters, polarizers and quarter-wave plates, placed in front of the camera. These optical elements sort out the polarization components contained in the radiation sequentially before this radiation is incident upon the camera. In such a polarization detection scheme, a series of infrared images have to be taken as the optical elements sort out the polarization at different directions. These earlier polarization detection systems taught by these studies have limitations that include: (1) The optical elements in such systems have to be displaced or rotated either manually or by automated mechanisms in a time-delayed manner since they are intended to observe an image with still objects. Any objects moving in an observed scene corrupts polarization characteristics of an object under observation. (2) Such a detection camera system is more expensive to implement due to additional hardware requirements of optical elements and automated control mechanisms wherein these additional hardware components also add weight and volume to such systems. (3) Since these optical elements of these systems are wavelength specific, the camera can only image the scene at a very narrow range of wavelengths. (4) The optical elements in these systems attenuate the incoming radiation. The last two factors reduce the sensitivity of the camera.

In view of these limitations, there is need for a simple and inexpensive polarization-sensitive infrared detector array for use in cameras and similar instruments, which the present invention provides.

SUMMARY AND ADVANTAGES OF THE INVENTION

The invention relates to polarization-sensitive infrared detector arrays for use in cameras and other instruments, which are comprised of a collection of C-QWIP detector units. The array is preferably in a two-dimensional array that can detect polarization contrast of an observed target object in a scene. Each detector unit is formed by a group of C-QWIP detectors having different groove orientations. Each detector unit is comprised of at least two C-QWIP detector elements with their respective corrugations oriented in orthogonal directions. Infrared detection by these detector units is primarily by polarization contrast, compared to intensity contrast, which is well known in the art. Also, by measuring polarization of reflected light from an observed target material, nature of this reflecting material can also be identified.

In a first embodiment of the invention, each detector unit comprises four C-QWIP elements. These detector units are further divided into two pairs. Each pair of C-QWIPs has groove orientation orthogonal to each other. The orthogonal directions form the principal axes for characterizing polarization-state of the radiation. The angle between these two pairs of axes is arbitrary. Also, in this embodiment of the invention, at least four C-QWIP detector elements are required in each unit for determination of a polarization state of incident radiation on in the detector unit. At least one detector unit is required to form an array, which can comprise many detector units in a unitary structure. A signal from each detector unit varies according to whether there is intensity variation or polarization variation. The polarization selectivity is intrinsic to each of the detector units. Each C-QWIP in a detecting unit is sensitive to one polarization, that is the polarization with the electric-field vector being perpendicular to the grooves.

A second embodiment of the invention comprises a detector unit having fewer than four C-QWIPs in individual detector units. Advantages of reducing the number of detector elements per unit include the ability to have more units built into an imaging array having a fixed area, thus increasing the resolution of the array. However, in this second embodiment, such detector units cannot completely resolve all the polarization properties of the radiation. Signal information from such detector units is partly dependent on the intensity and partly dependent on the polarization properties of the incident radiation thereupon. Such information is useful in applications requiring detection of objects without need for knowing all the polarization properties. This second embodiment is applicable in cameras or navigational instruments where radiation from an observed target object in a scene is highly polarized.

Applications of the invention using either embodiment of the polarization-sensitive detector arrays using C-QWIPs elements include infrared (IR) cameras and other instruments that can be used for landmine detection, missile interception, fire fighting, airplane deicing, navigational aid instruments, 3-D cameras and material surface inspection for quality control.

Accordingly, several advantages of the present invention include:

(a) Providing a polarization-sensitive infrared detector array using integrated C-QWIP detector elements to obviate the need for polarizing optical elements in IR detecting instruments.

(b) Providing a polarization-sensitive infrared detector array that acquires polarization-state information simultaneously.

(c) Providing a polarization-sensitive infrared detector array that is inexpensive to produce, which can be incorporated into cameras that are physically lighter and smaller compared to presently used IR based cameras with similar detection capabilities.

(d) Providing a polarization-sensitive infrared detector array comprised of corrugated quantum well infrared photodetectors (C-QWIP) units having at least two elements, wherein each unit is dependent of polarization.

The exact nature of this invention and advantages thereof will be readily apparent from consideration of the following specification relating to the annexed drawings wherein like reference letters and numerals correspond to like parts throughout the several views.

BRIEF DESCRIPTION OF THE DRAWINGS

FIG. 5 shows a polarization-sensitive focal plane array of the first embodiment of the invention in an exemplary form having detector units, wherein the detector elements A,B,C & D.

FIG. 6a shows the direction of the corrugated grooves of each of the detector element A, B, C and D in a detector unit relative to the crystallographic axes of the wafer.

FIG. 6b illustratively defines the electric field vector coordinates ($\hat{x}$, $\hat{y}$) and ($-4\hat{5}$, $4\hat{5}$) of the radiation in relation to the crystallographic coordinates ([011], [01$\bar{1}$]) and ([010], [001]) of the wafer in FIG. 6a respectively.

DETAILED DESCRIPTION OF THE PREFERRED EMBODIMENTS:

Conventional infrared detectors detect an object based upon intensity contrast of that object relative to its surroundings. When the object emits more intense light, the object appears brighter. However, intensity measurements are not the only useful information extracted from a radiation from an object. In general, naturally emitted light or reflected light consists of two components: an unpolarized component where its electric field vector points in random directions as a function of time, and a linearly polarized component where the electric field vector points in a fixed direction as a function of time.

Figure 1A:
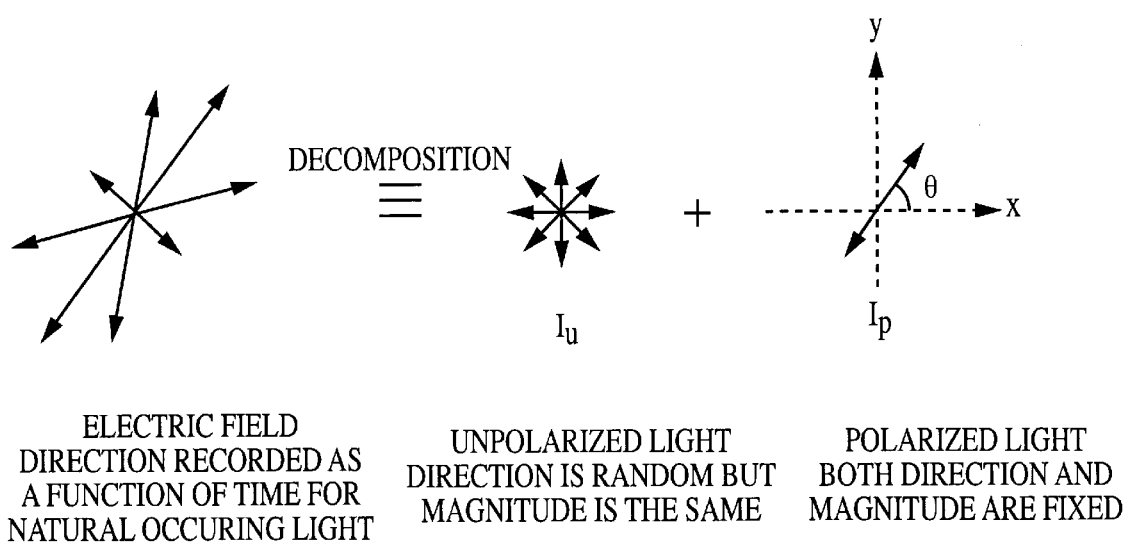
FIG. 1a illustrates partially polarized light resolved into two components, an unpolarized component $I_u$, and a polarized component $I_p$ wherein $I_u$ and $I_p$ can be further decomposed into orthogonal components along any two principal axes.
Figure 1B:
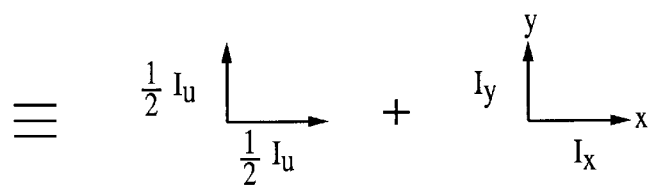
FIG. 1b illustrates principal axes $\hat{x}$ and $\hat{y}$, wherein $\hat{x}$ is defined along the [011] crystallgraphical axis and $\hat{y}$ is defined along the [01$\overline{1}$] axis of a wafer used in a detector unit.
Figure 1C:
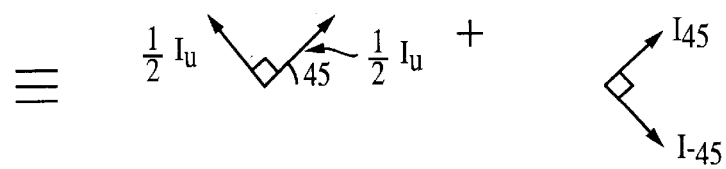
FIG. 1c illustrates principal axes at $-4\hat{5}$ and $4\hat{5}$, wherein the $-4\hat{5}$ axes is defined along the [010] axis and $4\hat{5}$ axes is defined along the [001] axis of a detector wafer.

FIG. 1a, 1b and 1c graphically show both of these components where the unpolarized intensity component is $I_u$ and the polarized intensity component is $I_p$. The total intensity is I. Both $I_u$ and $I_p$ can be further decomposed into two components along any principal axes:

$$I = \left(\frac{I_u}{2} + \frac{I_u}{2}\right) + (I_x + I_y), \quad (2)$$

or $$I = \left(\frac{I_u}{2} + \frac{I_u}{2}\right) + (I_{45} + I_{-45}). \quad (3)$$

Figure 2:
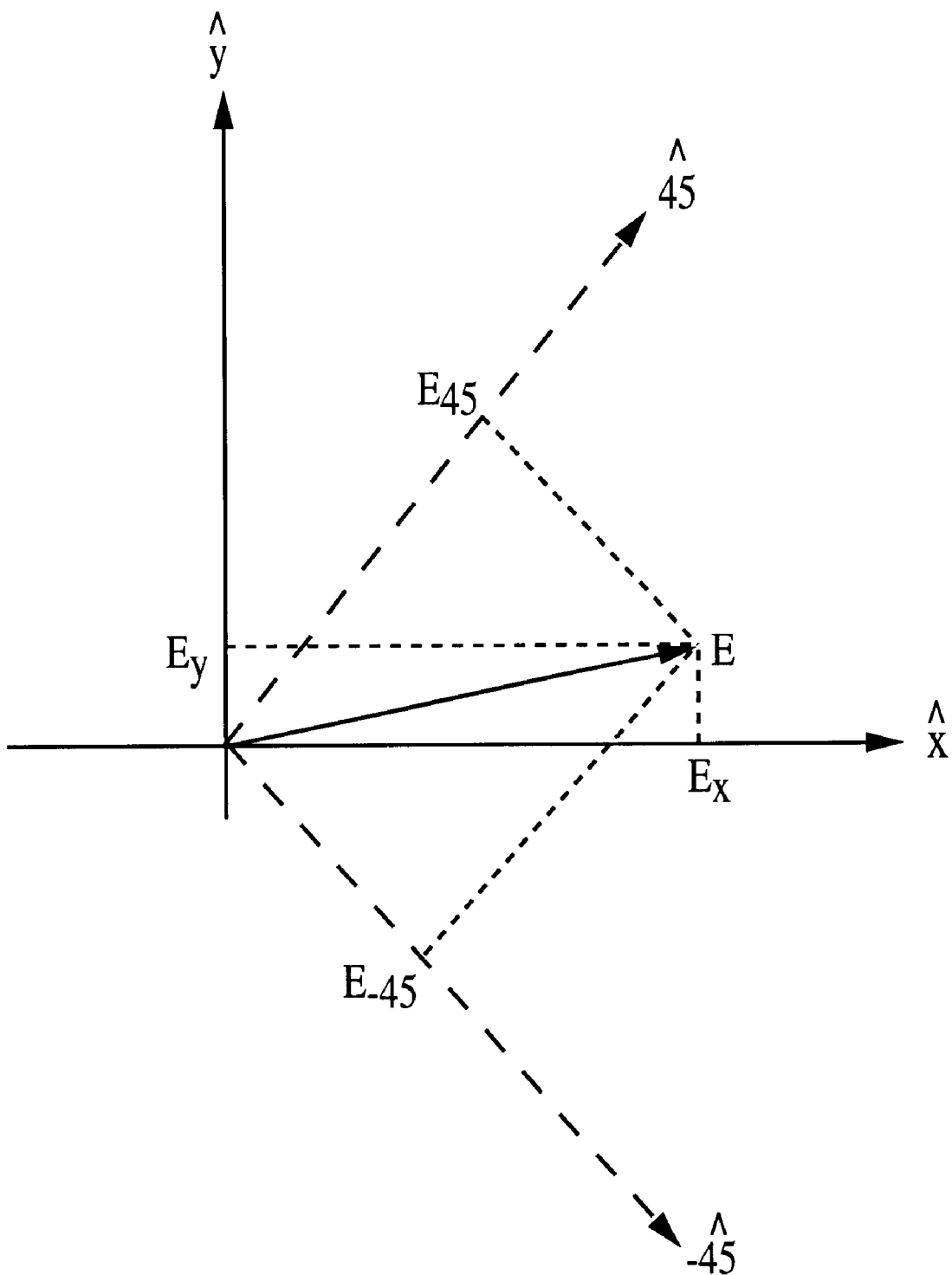
FIG. 2 illustrates the projection of the electric field vector E of incoming radiation onto two possible principal coordinate systems ($\hat{x}$, $\hat{y}$) and ($-4\hat{5}$, $4\hat{5}$).

In Eqn. (2), $\hat{x}$ and $\hat{y}$ axes are the principal axes. In Eqn. (3), the $\hat{x}$ and $\hat{x}$-axes are rotated by $-45°$. In this case, one principal axis is denoted as $-4\hat{5}$ and another as $4\hat{5}$ as shown in FIG. 2.

For the polarized component $I_p$, the electric field component $E_{-45}$ along the $-4\hat{5}$ and the electric field component $E_{45}$ along the $4\hat{5}$ are given by:

$$\begin{bmatrix} E_{-45} \\ E_{45} \end{bmatrix} = \begin{bmatrix} \sin 45° & -\cos 45° \\ \cos 45° & \sin 45° \end{bmatrix} \begin{bmatrix} E_x \\ E_y \end{bmatrix} \quad (4)$$
$$= \begin{bmatrix} 1/\sqrt{2} & -1/\sqrt{2} \\ 1/\sqrt{2} & 1/\sqrt{2} \end{bmatrix} \begin{bmatrix} E_x \\ E_y \end{bmatrix}$$

To completely characterize the polarization-state of an incoming light, $I_u$, $I_x$, $I_y$, and the orientation angle θ must be determined wherein:

$I_u$=intensity of the unpolarized component, $I_x$=the x intensity component of the polarized component, $I_y$=the y intensity component of the polarized component, and θ=the angle of the polarized component respect to the x axis. x axis is defined along the [011] crystallographical axis of the detector array used in the detection.

Under rare conditions, the radiation may also contain a circularly polarized component. Since the infrared detection takes place over many cycles of the optical frequency, the direction of the circularly electric vector takes on all possible angles during a signal collecting interval. Therefore, the circularly polarized component is detected as part of the unpolarized component and not distinguishable in the present detection scheme.

Figure 3:
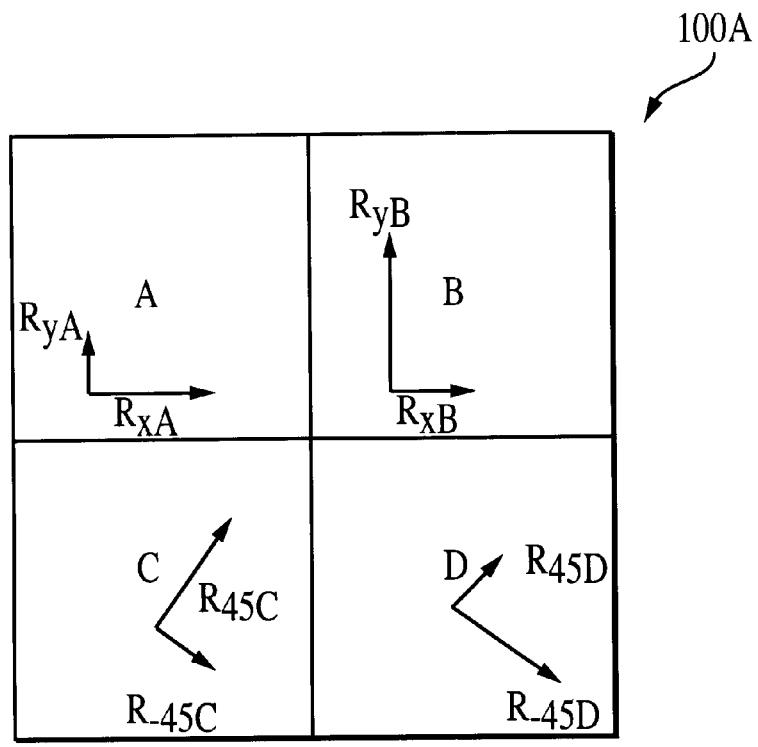
FIG. 3 illustrates the principal axes of detector elements A, B, C and D in an exemplary detector unit. The direction of each arrow indicates direction of the principal axis, whereas relative magnitude of the arrows indicates the relative magnitude of the responsivity when incoming light is polarized along that direction.

Since there are four unknowns $I_u$, $I_x$, $I_y$ and θ in characterizing incoming radiation (θ from $I_x$ and $I_y$ can only be determined up to the sign of θ), four linearly independent equations are required. To generate these four independent equations, four detectors are required, which should be polarization sensitive. FIG. 3 shows one exemplary form of four detector elements. Other design configurations are possible. The qualities of each detector elements A, B, C & D are as follows:

a) Each detector is polarization sensitive, i.e. the magnitude of the photo-response depends on the orientation angle θ, in addition to the total intensity I.

b) Each detector has a set of orthogonal principal axes. The photo-response is symmetrical with respect to the principal axes, that is R(θ)=R(−θ) where R is the detector responsivity, and θ is the angle between one of the axes and the electric vector of the polarized component.

In FIG. 3, detector elements A and B have principal axes that are placed along $\hat{x}$ and $\hat{y}$. For detectors C and D, the principal axes are placed at an angle away from $\hat{x}$ and $\hat{y}$. −45° is selected for illustration and can be an arbitrary angle.

By arbitrarily denoting that the responsivity of detector element A at θ=0° as being $R_{xA}$, and θ=90° as being $R_{yA}$ (by definition of polarization sensitivity, $R_{xA} \neq R_{yA}$) and assuming that $R_{xA} > R_{yA}$; and that detector element B has an $R_{xB}$ defined for θ=0°, and $R_{yB}$ for θ=90° with $R_{xB} \neq R_{yB}$, then with respect to these defined parameters $R_{xA}$, $R_{yA}$, $R_{xB}$, and $R_{yB}$, the photocurrents generated in detectors A and B are given by:

$$J_A = R_{xA}\left(\frac{I_u}{2} + I_x\right) + R_{yA}\left(\frac{I_u}{2} + I_y\right), \quad (5)$$

and

-continued $$J_B = R_{xB}\left(\frac{I_u}{2} + I_x\right) + R_{yB}\left(\frac{I_u}{2} + I_y\right). \quad (6)$$

For infrared detection, $J_A$ and $J_B$ are measured quantities. $R_{xA}$, $R_{yA}$, $R_{xB}$, and $R_{yB}$ are calibrated quantities. $I_u$, $I_x$, and $I_y$ are unknown quantities. By measuring $J_A$ and $J_B$, one hopes to deduce $I_u$, $I_x$, and $I_y$. Note that Eqns (5) and (6) are linearly independent only when $R_{xA}/R_{xB} \neq R_{yA}/R_{yB}$ or equivalently $R_{xA}/R_{yA} \neq R_{xB}/R_{yB}$. That is, the detectors A and B cannot be identical detectors, or have the same polarization dependence. A sensitive polarization detector system should have the ratio $R_{xA}/R_{yA}$ very different from $R_{xB}/R_{yB}$. If we assume $R_{xA} > R_{yA}$, ideally we should have B such that $R_{xB} < R_{yB}$.

Figure 4:
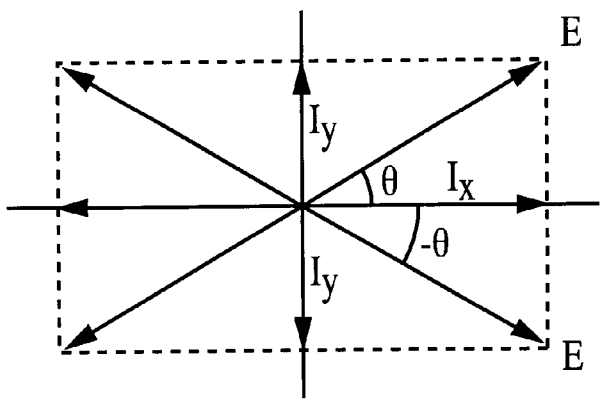
FIG. 4 illustrates two possible orientation angles $\theta$ and $-\theta$ given the same magnitude of $I_x$ and $I_y$.

Since there are three unknown quantities $I_u$, $I_x$, and $I_y$ in Eqns (5) and (6), at least one more detector is needed to provide one additional equation. However, even with the knowledge of $I_u$, $I_x$, and $I_y$, complete determination of the state of polarization of light cannot be accomplished due to the fact that two different orientation angles $\theta$ and $-\theta$ give the same magnitudes of $I_x$ and $I_y$ as shown in FIG. 4. Therefore, to uniquely determine $\theta$, which is the fourth unknown, at least four detectors are required. The third detector element C, is chosen such that $R_{45C} > R_{-45C}$ and the fourth detector element D is chosen such that $R_{45D} < R_{-45D}$.

For detectors elements C and D, the photocurrent is:

$$J_C = R_{45C}\left(\frac{I_u}{2} + I_{45}\right) + R_{-45C}\left(\frac{I_u}{2} + I_{-45}\right). \quad (7)$$

and $$J_D = R_{45D}\left(\frac{I_u}{2} + I_{45}\right) + R_{-45D}\left(\frac{I_u}{2} + I_{-45}\right). \quad (8)$$

Rearranging Eqns (5), (6), (7) and (8), $$J_A = \frac{R_{xA} + R_{yA}}{2} I_u + R_{xA} I_x + R_{yA} I_y, \quad (9)$$

$$J_B = \frac{R_{xB} + R_{yB}}{2} I_u + R_{xB} I_x + R_{yB} I_y, \quad (10)$$

$$J_C = \frac{R_{45C} + R_{-45C}}{2} I_u + R_{45C} I_{45} + R_{-45C} I_{-45}, \quad (11)$$

$$J_D = \frac{R_{45D} + R_{-45D}}{2} I_u + R_{45D} I_{45} + R_{-45D} I_{-45}, \quad (12)$$

The next step is to express $I_{45}$ and $I_{-45}$ in terms of $I_x$, $I_y$, and $\theta$. Note that for oscillating electric field, $\theta$ is confined to the range $-90° < \theta < 90°$. From Eqn (4), $E_{45} = E_x/\sqrt{2} + E_y/\sqrt{2}$. Since $I_{45} = aE_{45}^2$, where $a = n/(2z_o)$, n is the reflective index and $z_o$ is the impedence of free space, $$I_{45} = a\left(\frac{E_x}{\sqrt{2}} + \frac{E_y}{\sqrt{2}}\right)^2 \quad (13)$$

$$= \frac{1}{2} aE_x^2 + \frac{1}{2} aE_y^2 + aE_x E_y$$

$$= \frac{I_x}{2} + \frac{I_y}{2} + \sqrt{I_x I_y} \quad \text{if } \theta > 0$$

$$= \frac{I_x}{2} + \frac{I_y}{2} - \sqrt{I_x I_y} \quad \text{if } \theta < 0.$$

Similarly $$I_{-45} = a\left(\frac{E_x}{\sqrt{2}} - \frac{E_y}{\sqrt{2}}\right)^2 \quad (14)$$

$$= \frac{1}{2} aE_x^2 + \frac{1}{2} aE_y^2 - aE_x E_y$$

$$= \frac{I_x}{2} + \frac{I_y}{2} - \sqrt{I_x I_y} \quad \text{if } \theta > 0$$

$$= \frac{I_x}{2} + \frac{I_y}{2} + \sqrt{I_x I_y} \quad \text{if } \theta < 0.$$

From Eqns. (11) and (12), $$\frac{J_C + J_D}{2} = \frac{R_{45C} + R_{-45C} + R_{45D} + R_{-45D}}{4} I_u + \quad (15)$$

$$\frac{R_{45C} + R_{45D}}{2} I_{45} + \frac{R_{-45C} + R_{-45D}}{2} I_{-45},$$

and $$\frac{J_C - J_D}{2} = \frac{R_{45C} + R_{-45C} - R_{45D} - R_{-45D}}{4} I_u + \quad (16)$$

$$\frac{R_{45C} - R_{45D}}{2} I_{45} + \frac{R_{-45C} - R_{-45D}}{2} I_{-45},$$

As described below, the detector elements C and D are such that $R_{45C} = R_{-45D}$, and $R_{-45C} = R_{45D}$ (shown in FIG. 3) with $R_{45C} > R_{-45C}$. With this special case, $$\frac{J_C + J_D}{2} = \frac{R_{45C} + R_{-45C}}{2} I_u + \frac{R_{45C} + R_{-45C}}{2} (I_{45} + I_{-45}) \quad (17)$$

$$= \frac{R_{45C} + R_{-45C}}{2} I_u + \frac{R_{45C} + R_{-45C}}{2} (I_x + I_y),$$

and $$\frac{J_C - J_D}{2} = \frac{R_{45C} - R_{-45C}}{2} (I_{45} - I_{-45}) \quad (18)$$

$$= (R_{45C} - R_{-45C})\sqrt{I_x I_y} \quad \text{for } \theta > 0$$

$$= -(R_{45C} - R_{-45C})\sqrt{I_x I_y} \quad \text{for } \theta < 0.$$

Therefore, with $R_{45C} = R_{-45D}$ and $R_{-45C} = R_{45D}$, the equations can be greatly simplified. It represents a preferred design. But in general, these two relations are not required.

Since Eqn. (17) is independent of the sign of $\theta$, decoupling of the four equations (9), (10), (11) and (12) can be accomplished and written as:

$$J_A = \frac{R_{xA} + R_{yA}}{2} I_u + R_{xA} I_x + R_{yA} I_y \quad (19)$$

$$J_B = \frac{R_{xB} + R_{yB}}{2} I_u + R_{xB} I_x + R_{yB} I_y$$

$$\frac{J_C + J_D}{2} = \frac{R_{45C} + R_{-45C}}{2} I_u + \frac{R_{45C} + R_{-45C}}{2} I_x + \frac{R_{45C} + R_{-45C}}{2} I_y,$$

and $$\theta = \frac{J_C - J_D}{|J_C - J_D|} \tan^{-1}\left[\sqrt{\frac{I_y}{I_x}}\right]. \quad (20)$$

From Eqn. (19), after measuring $J_A$, $J_B$, and $(J_C+J_D)/2$ from the observed object, the intensity components $I_u$, $I_x$, and $I_y$ can be deduced from a matrix multiplication $$\begin{bmatrix} I_u \\ I_x \\ I_y \end{bmatrix} = \begin{bmatrix} (R_{xA}+R_{yA})/2 & R_{xA} & R_{yA} \\ (R_{xB}+R_{yB})/2 & R_{xA} & R_{yA} \\ \frac{(R_{45C}+R_{-45C})}{2} & \frac{(R_{45C}+R_{-45C})}{2} & \frac{(R_{45C}+R_{-45C})}{2} \end{bmatrix}^{-1} \begin{bmatrix} J_A \\ J_B \\ \frac{J_C+J_D}{2} \end{bmatrix}. \quad (21)$$

and θ is given by Eqn. (20) after we obtain $I_x$ and $I_y$.

First Array Embodiment

FIG. 5 shows a two-dimensional n×m array having detector units (cells), each unit (cell) consist of detector elements A, B, C and D. The number of detector cells is arbitrary. The photocurrent generated in each detector element is connected to an electronic circuit for independent signal readout. The photocurrents $J_A$, $J_B$, $J_C$, and $J_D$ from each detector unit (cell) are determined by the polarization properties of a particular spot in an observed scene. From the values of $J_A$, $J_B$, $J_C$, and $J_D$, the intensity components $I_u$, $I_x$ and $I_y$ and the orientation angle θ can be calculated using Eqns. (21) and (20), respectively. In a sensitive camera, it is desirable that $R_{xA} \gg R_{yA}$, and $R_{xB} \ll R_{yB}$, although such criteria need not necessary for operational use. Also, for Eqns (21) and (20) to be valid, these requirements must be satisfied:

$$R_{45C}=R_{-45D}, \quad (22)$$

$$R_{-45C}=R_{45D}, \quad (23)$$

and $$R_{45C}>R_{-45C}. \quad (24)$$

A polarization sensitive camera can be implemented without satisfying Eqns. (22), (23) and (24). In this case, the mathematical algorithm is more complicated. After obtaining the four quantities $I_u$, $I_x$ and $I_y$ and θ from the scene, observations of the scene or detected object provide four different qualities thereof: (1) the contrast in the unpolarized intensity component $I_u$, (2) the contrast in the intensity of horizontal polarization component $I_x$, (3) the contrast in the intensity of vertical polarization component $I_y$, and (4) the contrast in the orientation angle θ.

The polarization-sensitive detector units (cell) 100A are made using methods as taught in my U.S. Pat. No. 5,485,015 entitled "Quantum Grid Infrared Photodetectors," which is hereby incorporated by reference. Quantum grid infrared photodetectors (QGIPs) in this patent originally refer to a class of QWIP structure having an array of grooves or cavities in the detector active volume as a means of normal incident light coupling. This detector structure is in contrast to prior art using gratings on top of the active volume for light coupling.

As described in my earlier U.S. Pat. No. 5,485,015, C-QWIPs can be produced by plasma or chemical etching techniques. In the present preferred embodiment, C-QWIPs will be created using a specific chemical etching solution: $H_2SO_4$—$H_2O_2$—$H_2O$. With this etching solution, a specific set of sidewall profiles will be obtained. Other chemical etchants are also available, which may result in a different set of sidewall profiles.

Figure 6C:
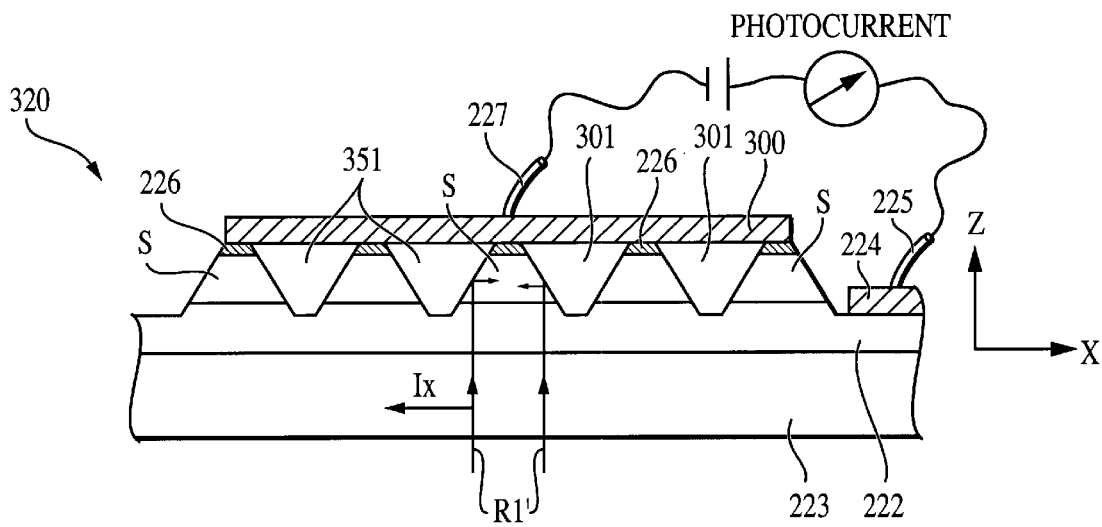
FIG. 6c shows a side-view of detector element A on the (x,z) plane and change of polarization of $I_x$ into $I_z$ upon sidewall reflection.
Figure 6D:
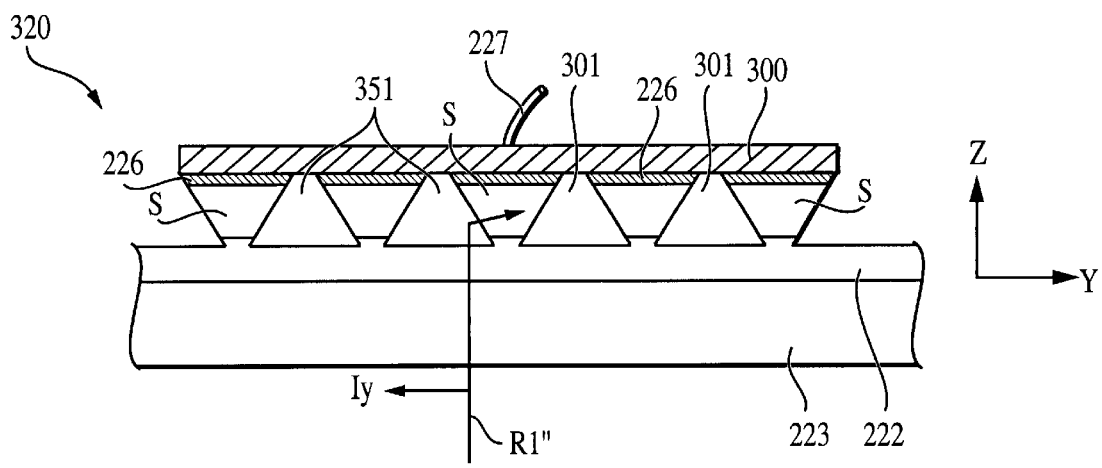
FIG. 6d shows a side-view of detector element B along the (y,z) plane and change of polarization of $I_y$ into $I_z$ upon sidewall refraction.
Figure 6E:
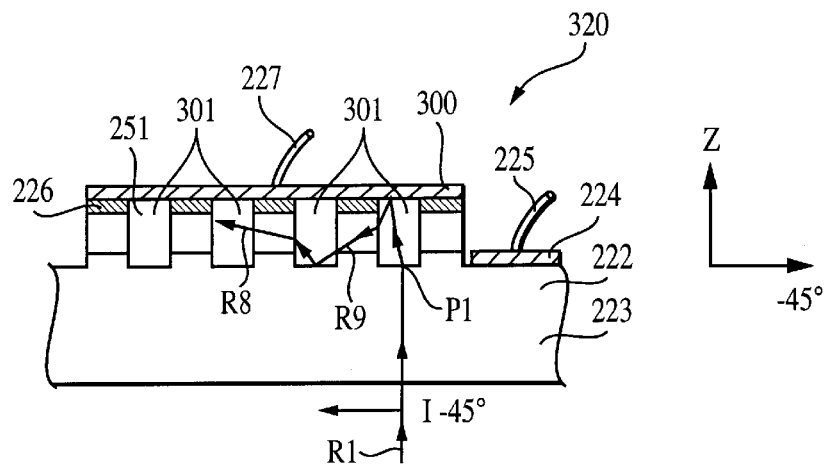
FIG. 6e shows a side-view of detector element D along the ($-4\hat{5}$, z) plane and change of polarization of $I_{-45}$ into $I_z$ upon sidewall diffraction.

In additional to the chemical composition of the etchant, the sidewall profile of the grooves also depends on the orientation of the grooves relative to the crystallographical directions. For the detector element A, as shown in modified form as FIG. 14 in my earlier U.S. Pat. No. 5,485,015, the grooves are aligned along the [01$\bar{1}$] direction. In case of $H_2SO_4$—$H_2O_2$—$H_2O$, after chemical etching, the sidewall forms triangular corrugations as shown in FIG. 6c herein. The resulting sloped sidewall is due to the different chemical etching rates for different crystallographic planes. Experimentally, the interior angle of the slope is observed to be about 50° relative to the [011] axis. Similarly for the detector element B, as shown in modified form as FIG. 15 in my earlier U.S. Pat. No. 5,485,015, after chemical etching, the sidewall forms inverted-V form notched corrugations as shown in FIG. 6d herein. The exterior angle is about 60° relative to the [011] axis. In addition, the grooves of detectors C and D are aligned along [010] and [001], respectively. The sidewalls of detectors C and D are essentially vertical as shown in FIG. 6e.

FIG. 6c, d, and e schematically depict the physical construction of C-QWIPs having different groove orientations. Apart from different sidewall profiles, each C-QWIP is made of the same detector material, which comprises a stack S of alternate semiconductor material barrier layers and well layers sandwiched between two contact layers 226 and 222. Lower contact layer 222, which is formed on transparent substrate 223, supports metal contact 224 which connects to electrical conductor 225. Upper contact layer 226 supports metal contact 330, which connects to electrical conductor 227. A typical material system for C-QWIP is $In_yGa_{1-y}As/Al_xGa_{1-x}As$. Using this material system as an example, the composition of the semiconductor layers is as follows: substrate 223 is formed from undoped Gallium Arsenide (GaAs); quantum well layers are formed from doped Indium Gallium Arsenide (InGaAs); contact layers 226 and 222 are formed from highly doped GaAs; and barrier layers are formed from undoped Aluminum Gallium Arsenide (AlGaAs).

Figure 7:
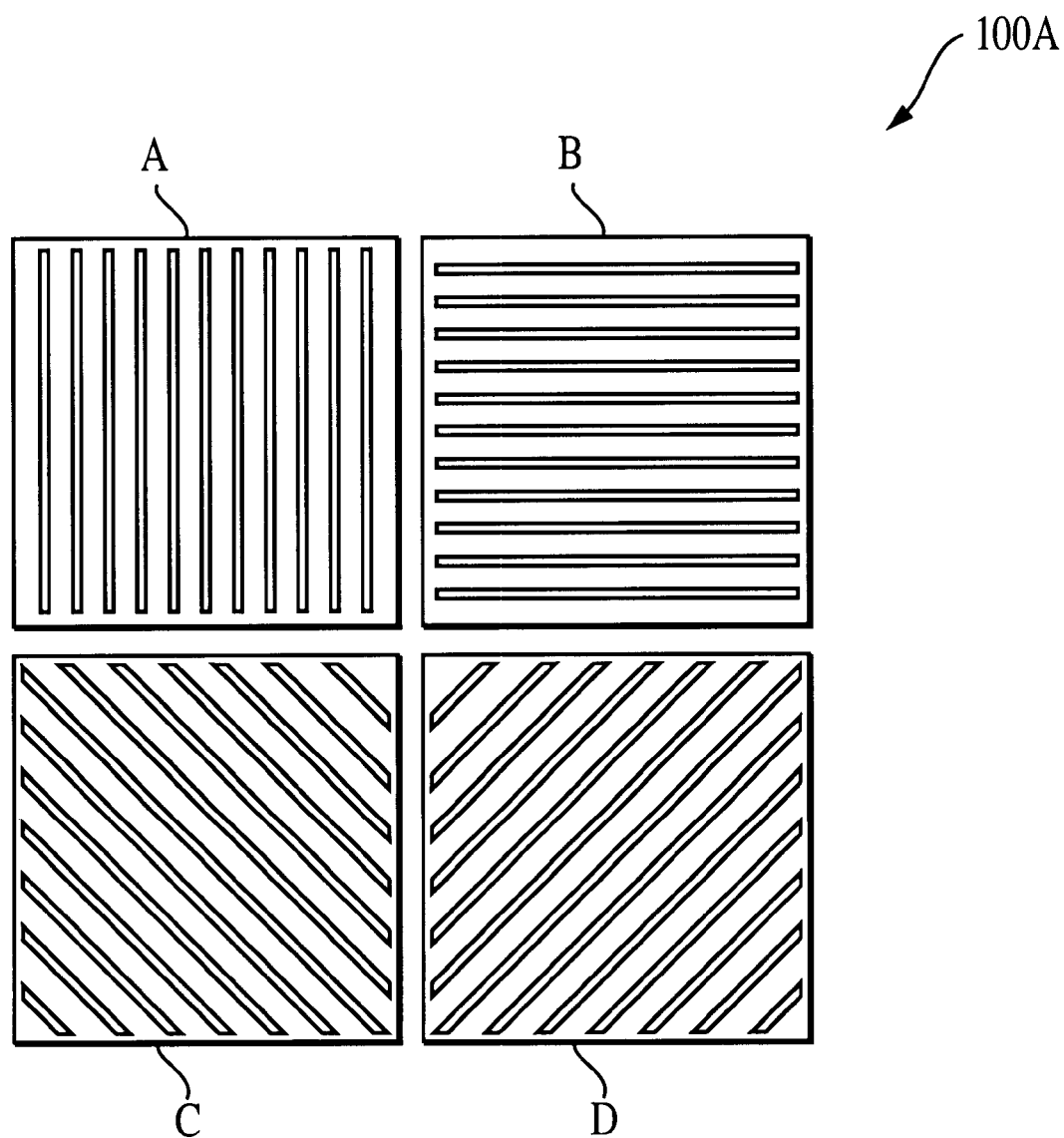
FIG. 7 shows an etching mask with different groove directions of detector elements A,B,C and D.

To produce the C-QWIPs depicted in FIG. 6c, d, and e, grid patterns of spaced, rectangular slits, arranged in parallel rows, are opened in the photoresist on top of the detector material for chemical etching as shown in FIG. 7. Through the slit openings, the chemical etchant removes part of the top contact layer 226 and part of the active material volume S, and reaches down to the top of the bottom contact layer 222, forming cavities of desirable spacing.

Figure 11A:
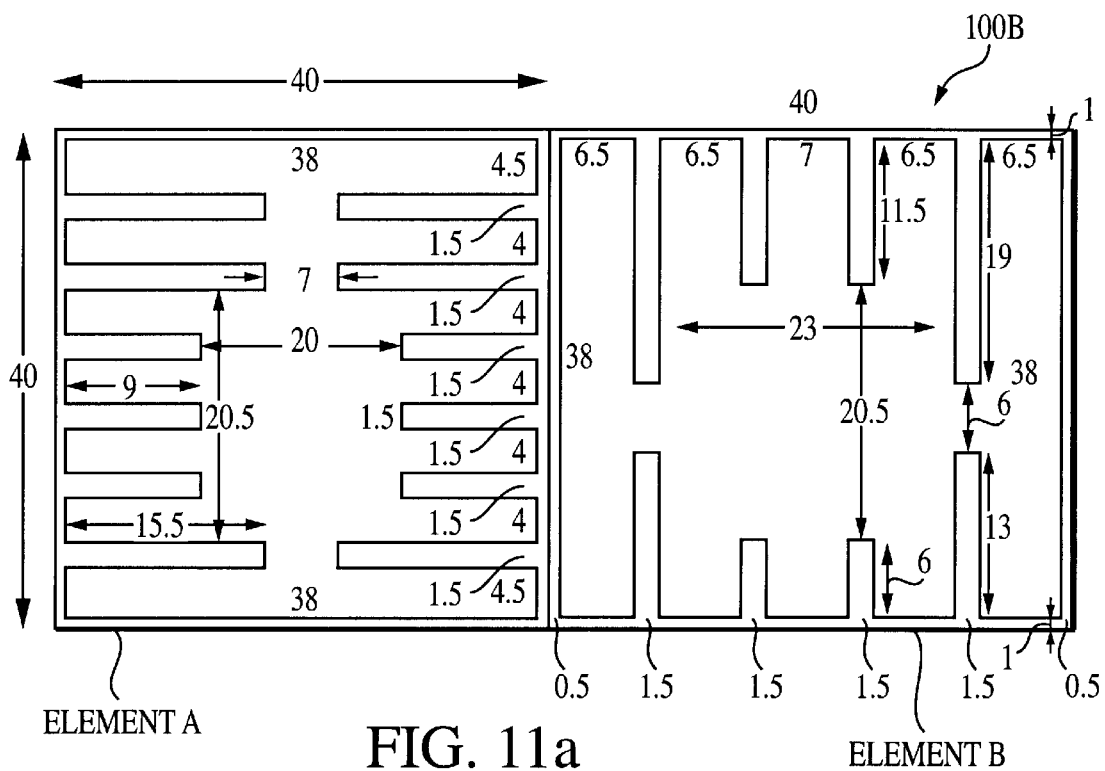
FIG. 11a shows an exemplary etching mask pattern of a polarization-sensitive detector unit using A and B type elements.

After the corrugated sidewalls are formed, an insulating dielectric material is used to fill the cavities. The refractive index of the dielectric should be smaller than that of the detector material S. Metal contact layers are then deposited on top of the contact layers 226 and 222. Electrical connections are then provided by indium bump bonding to the readout circuits. The main purpose of the insulating material is to prevent the shorting of the top metal contact with the bottom contact layer. In FIG. 11(a), we provide an alternative mask geometry design that can eliminate the need of the insulating material. In this detector geometry, an unetched region is created near the center of the detector area. The top metal contact is deposited only on top of this unetched area. The shorting thus can be prevented without the need of an insulating layer.

FIG. 6a shows the direction of the corrugated grooves of each detector element A, B, C and D in a detector unit relative to the crystallographic axes of the detector wafer. The detector units are in turn arranged in an array format shown in FIG. 5. FIG. 6b shows the definition of the electric field vector coordinates ($\hat{x}$, $\hat{y}$) and ($-4\hat{5}$, $4\hat{5}$) of the radiation in relation to the crystallographic coordinates ([011], [01$\bar{1}$]) and ([010], [001]) of the detector wafer, respectively. FIG. 6c shows a side-view of detector A on the (x,z) plane (along the dashed line in FIG. 6a) and also shows the change of polarization of $I_x$ into $I_z$ upon sidewall reflection. FIG. 6d shows a side-view of detector B along the (y,z) plane (along the dashed line in FIG. 6a) and also a change of polarization of $I_y$ into $I_z$ upon sidewall refraction. FIG. 6e shows a side-view of detector D along the ($4\hat{5}$, z) plane (along the dashed line in FIG. 6a) and also change of polarization of $I_{-45}$ into $I_z$ upon sidewall diffraction.

In greater detail, FIG. 6c depicts the propagation of incident IR radiation R1 normal to the broad surface of stack S. If R1 is polarized with the electric vector pointing at the x-direction, (i.e. along [011]), after R1 is internally reflected by the sidewall, R1 will change its polarization to the z direction. For a QWIP, it only absorbs light with component polarized along the z direction. Therefore, R1 can be absorbed and produces photocurrent. On the other hand, if R1 is polarized along the y direction (i.e into of the paper in FIG. 6c), R1 is still polarized along the y direction after reflection at the sidewall, and therefore will not be absorbed by detector A. With this absorption feature, $R_{xA}$>>$R_{yA}$ is satisfied. Similarly, for detector B, after chemical etching, inverted corrugations are formed along the y direction i.e. along [01$\bar{1}$]. The corrugations change the y-polarization by refraction into the z direction, but they will not change the x-polarization. Therefore, we have $R_{xB}$<<$R_{yB}$. When we etch the grooves either along the [001] and [010] directions, substantially straight sidewalls are created for both detector elements C and D. Thus, $R_{45C}$=$R_{-45D}$ and $R_{-45C}$=$R_{45D}$ as required. Detector elements C and D couple the light through diffraction. Detector elements C and D change only one polarization, either the $I_{45}$ or the $I_{-45}$ polarization respectively, into the z polarization, and hence $R_{45C}$>>$R_{-45C}$ as required.

Variations to this design include having different sidewall profiles for the elements A, B, C and D. So long as grooves are orientated in different directions in each detector element, the shape of the sidewall is less important. The shape of the sidewall will affect only the absorption of the radiation with polarization perpendicular to the grooves and hence the overall detector sensitivity. But since such a detector will not absorb the parallel polarization, the polarization selectivity is nevertheless retained. By using the preferred chemical etching solution, the sidewall profiles as described above are obtained. By using other chemical etchants, different sidewall profiles can be obtained. The cavity grooves in each of the detector element's active material can also be done by differing techniques well known in the chip arts. These include plasma etching to produce the desired sidewall profiles.

Figure 8:
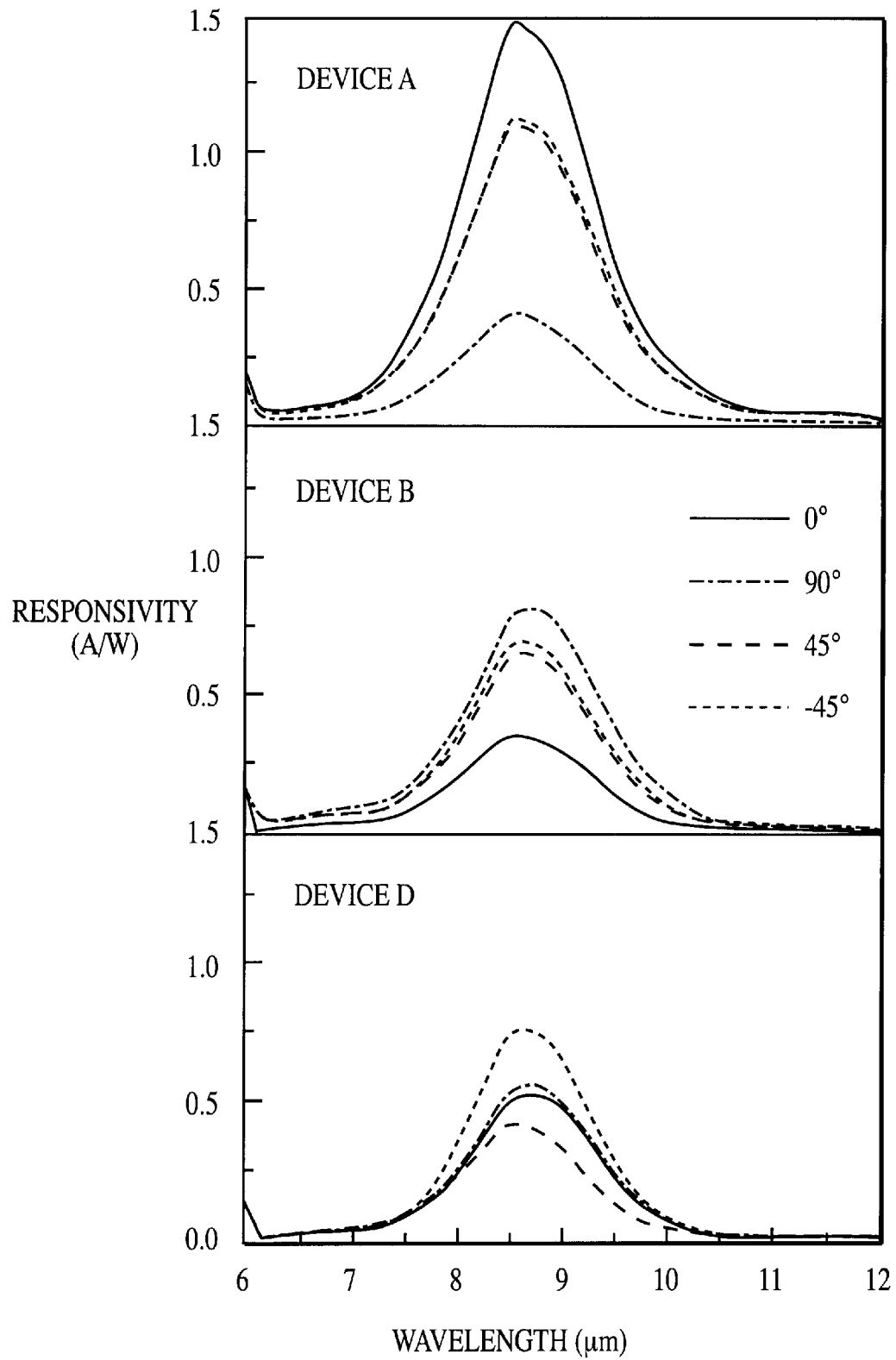
FIG. 8 shows responsivity of detector elements A, B and D as a function of wavelength for radiation at different orientation angles.

FIG. 8 shows the respective responsivity R for different polarization of light. For detectors A, R is the largest for the orientation angle $\theta$=0° (i.e. x-polarization and is represented by the solid curve). R is smallest for $\theta$=90° (y-polarization) For detector element B, R for $\theta$=90° is the largest and that for $\theta$=0° is the smallest. For detector element D, R for 45° is the smallest and R for −45° is the largest. All these detector characteristics satisfy the polarization detection requirements discussed above. By integrating this detector unit (cell) 100A into a focal plane array, one can detect individual polarization components and the orientation angle.

Second Array Embodiment

The second array embodiment of the invention is sensitive to both intensity and polarization characteristics of an observed scene.

Figure 9:
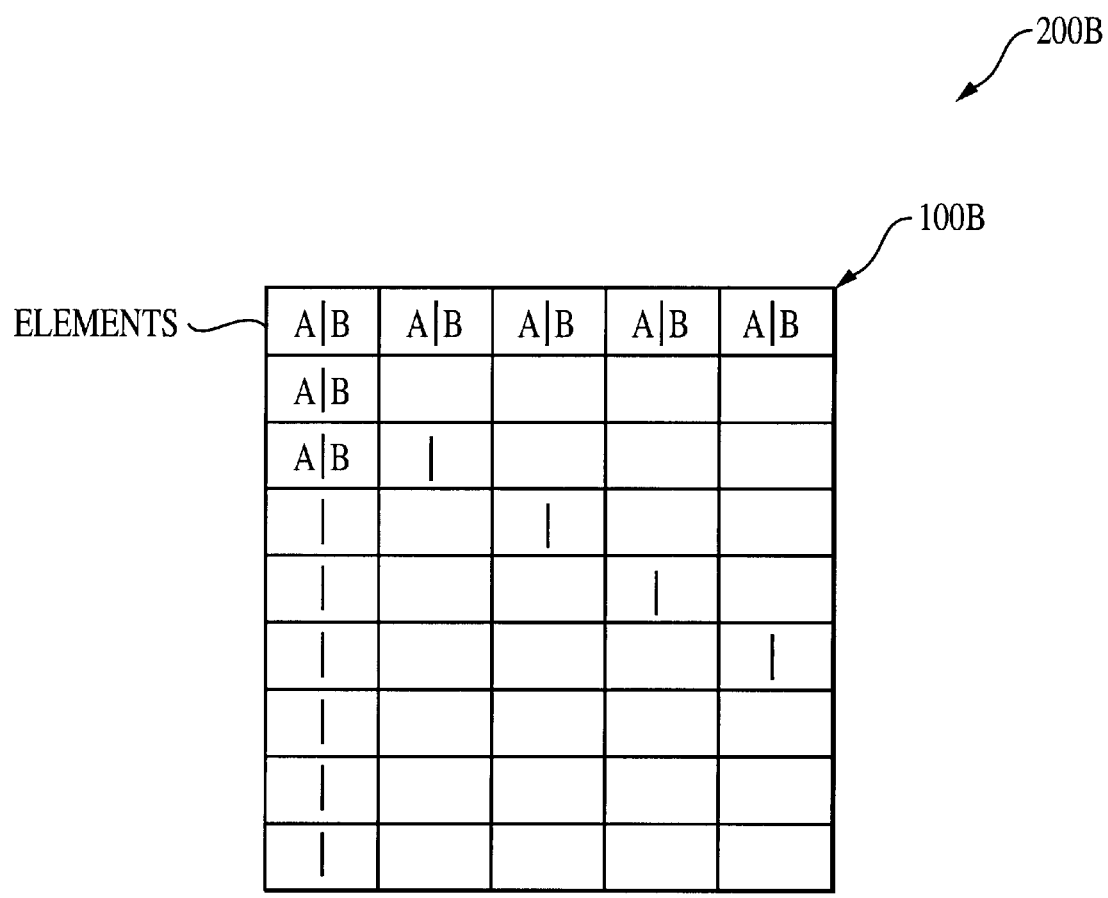
FIG. 9 shows a polarization-sensitive focal plane array of the second embodiment of the invention in an exemplary detector unit arrangement wherein the detector unit has A and B-type elements.

In the first array 200A of the invention, there are four detector elements A, B, C and D in each detector unit 100A. With four detector elements, the state of polarization of light can be completely determined. On the other hand, for the purpose of object detection and recognition, there may not be need for complete information of the incident radiation upon the detector. For infrared detection, it is possible just to use two detectors in another form of a detector unit 100B for polarization-sensitive detection. With fewer detector elements in each unit, the resolution of a detector array can be doubled as shown in FIG. 9. The mathematical algorithm used can also be simplified.

In the following, we will use detectors A and B for illustration. Considering two objects, both emit radiation at the same intensity level. If the infrared detection is just based on the intensity contrast, one will not be able to differentiate them. On the other hand, if we take the ratio of the photocurrent generated in detectors A and B, we obtained from Eqns. (9) and (10):

$$\frac{J_A}{J_B} = \frac{(R_{xA} + R_{yA})/2 \cdot I_u + R_{xA}I_x + R_{yA}I_y}{(R_{xB} + R_{yB})/2 \cdot I_u + R_{xB}I_x + R_{yB}I_y}. \quad (25)$$

Since Eqn. (25) explicitly depends on the individual intensity components $I_u$, $I_x$, and $I_y$; $J_A/J_B$ will be different if two objects emit different amount of $I_u$, $I_x$, and $I_y$ even though the total intensity (I=$I_u$+$I_x$+$I_y$) may be the same.

In addition to detecting the $J_A/J_B$ ratio, the camera can also be used to display $J_A$ images, which mainly depends on the $I_x$ contrast; or to display $J_B$ images, which mainly depends on the $I_y$ contrast. If the radiation from the scene is totally unpolarized, (that is, I=$I_u$, and $I_x$=$I_y$=0), then the ratio $J_A/J_B$ will always be a constant and is equal to ($R_{xA}$+$R_{yA}$)/($R_{xB}$+$R_{yB}$) even if the total intensity I is different. In this case, infrared detection based on the $J_A/J_B$ ratio is not useful.

Therefore, the design of a polarization-sensitive camera with only two detector elements in each detecting unit is useful only when the magnitude of polarization in the radiation is high. On the other hand, a design with four detector elements for use in an IR camera is useful under all circumstances.

When the magnitude of polarization is high, i.e. $I_p$>>$I_u$, the ratio $J_A/J_B$ depends predominantly on the orientation angle and not on the total intensity. In the extreme case when $I_u$=0, $$I = I_x + I_y = I\cos^2\theta + I\sin^2\theta. \quad (26)$$

Substituting Eqn. (26) into Eqn. (25) with $I_u$=0 yields $$\frac{J_A}{J_B} = \frac{I(R_{xA}\cos^2\theta + R_{yA}\sin^2\theta)}{I(R_{xB}\cos^2\theta + R_{yB}\sin^2\theta)} \quad (27)$$
$$= \frac{(R_{xA} + R_{yA}) + (R_{xA} - R_{yA})\cos 2\theta}{(R_{xB} + R_{yB}) + (R_{xB} - R_{yB})\cos 2\theta}.$$

The ratio $J_A/J_B$ in this case is only a function of $\theta$ but not I. Therefore, when the radiation is totally polarized, $J_A/J_B$ changes with the orientation angle but is independent of the intensity variation.

Two examples are provided to illustrate the principle of the detector unit 100A. In a first example, a polarizer is disposed in front of a blackbody scene, and the detectors A and B sense radiation as a function of polarization angle. The polarization angle sets the orientation angle $\theta$ relative to the detector elements. In this example, the initial value (0°) of the polarization angle is aligned as close to the [011] direction as possible. In this case, the polarization angle is nearly the same as θ.

Figure 10A:
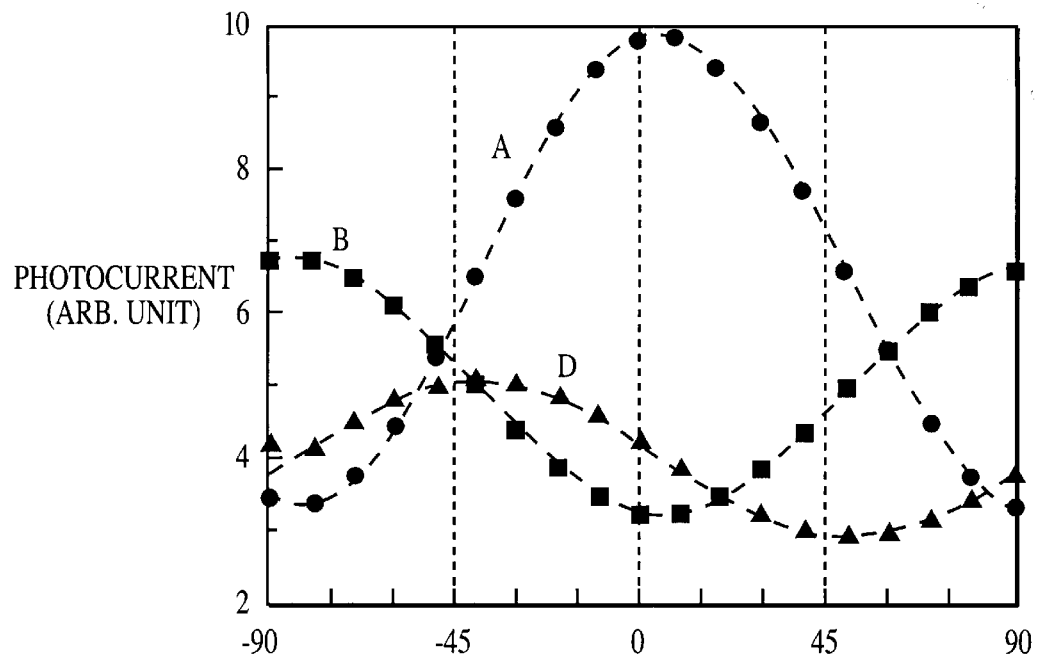
FIG. 10a shows variation of photocurrent of detectors A, B and D as a function of polarization angle of a polarized light.
Figure 10B:
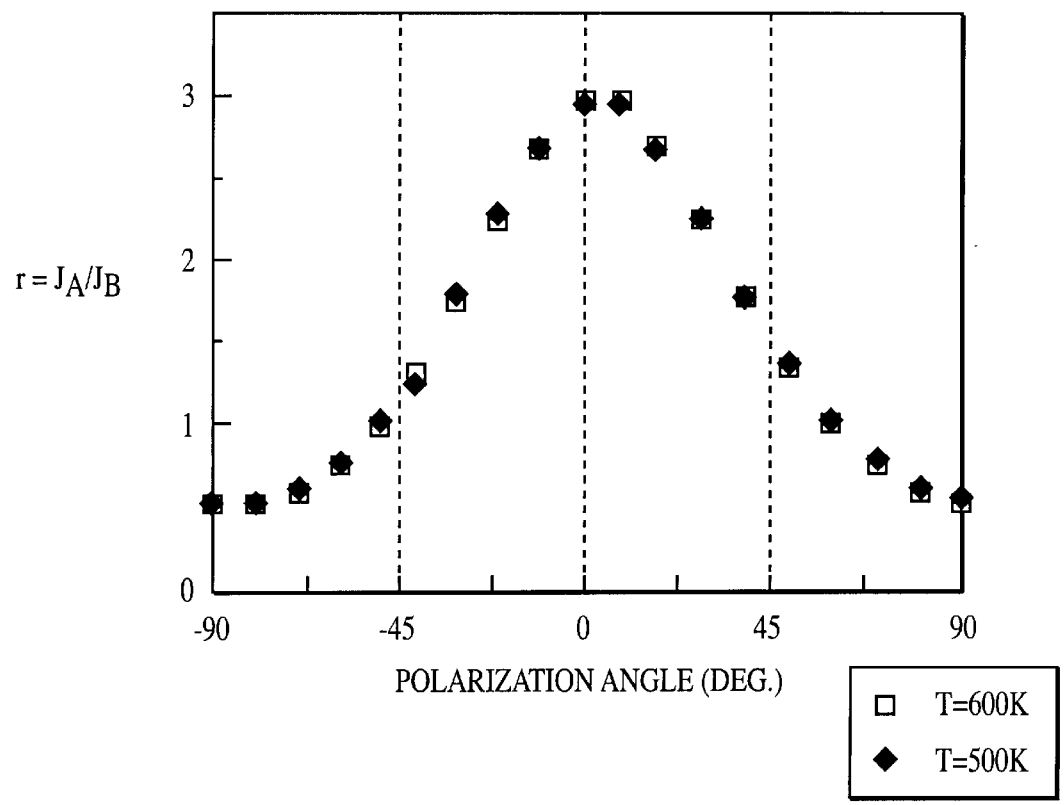
FIG. 10b shows ratio of photocurrent of detectors A and B as a function of polarization angle with respect to two blackbody source temperatures.

After passing through the polarizer, the blackbody radiation is totally polarized. FIG. 10a shows the individual photocurrent of detectors A (circles), B (squares) and D (triangles). Since $J_A(0°)>>J_A(90°)$, and $J_B(90°)<<J_B(90°)$, thus the conditions that $R_{xA}>>R_{yA}$, and $R_{xB}<<R_{yB}$ are satisfied. From Eqn. (27), the current ratio is expected to be different for different polarization angles. Indeed, FIG. 10(b) shows $J_A/J_B$ changes with the polarization angle even though the intensity maintains to be the same for different angles.

To show that the value of $J_A/J_B$ does not depend on the intensity for polarized light, we increase the blackbody radiation intensity by increasing the blackbody temperature from 500 K to 600 K. The value of $J_A/J_B$ remains to be the same. This experiment shows that $J_A/J_B$ is purely dependent of θ when the radiation is highly polarized.

A second example shows the detection of an object can be based on the infrared light reflected from the object. When the unpolarized radiation is reflected off of a surface, the radiation usually becomes partially polarized. The degree of polarization and the polarization angle relative to the surface depends on the surface properties of the object. Different materials reflect light with different polarization properties. Based on these properties, a polarization-sensitive camera can be used to detect the target object and also identify the type of material upon which the incident radiation is reflected.

Using a blackbody, by illuminating a material surface at 45°, these results are confirmed. This radiation is modulated by an optical chopper. The surface is aligned along the [01$\bar{1}$] direction, i.e. y-axis. Without placing any optical element in front of the detectors, the value of $J_A/J_B$ can be measured for different materials. Table 1 shows these results, in which $J_A/J_B$ are different for different materials, or for the same material but with different surface treatment. By detecting the value of $J_A/J_B$, detection and identification of different objects can be obtained even though the reflected intensity may be the same. If one assumes that the reflected light is totally polarized, one can also deduce the value of θ from Eqn. (27). The corresponding value of θ is also listed in Table 1. One can then display the θ contrast of a scene if one chooses to. However, the display of $J_A/J_B$ contrast of the scene is sufficient to detect an object.

Table 1 as follows exemplifies measured current ratio and the interpreted orientation angle of the reflected light from a material surface of an observed object.

TABLE 1

| Material | $J_A/J_B$ | θ (degree) |
|---|---|---|
| gold | 1.41 | 48.6 |
| black metal plate | 1.35 | 50.0 |
| painted aluminum | 0.605 | 78.3 |
| bare aluminum | 1.36 | 49.8 |
| white paper | 0.694 | 72.7 |
| tissue | 0.846 | 65.6 |
| handkerchief | 0.983 | 60.6 |
| tree bark | 0.805 | 67.3 |
| glass plate | 0.844 | 65.7 |
| mirror | 0.759 | 65.1 |
| leaf | 0.683 | 73.4 |
| black plastics | 0.594 | 79.2 |
| white plastics | 0.597 | 78.9 |

Figure 11B:
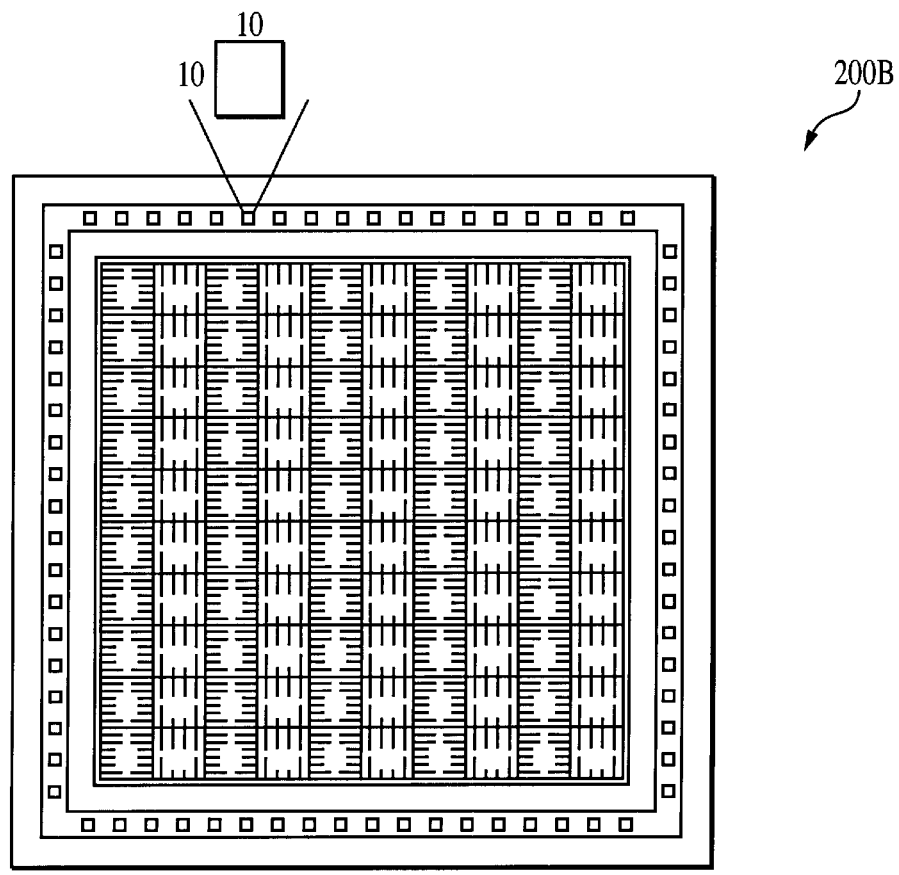
FIG. 11b shows an exemplary arrangement of the detector units in a 5×10 detector array. The 10×10 micrometers$^2$ squares surrounding the array are unetched islands for bottom common contacts of the detector elements.

FIG. 11a shows an example of an etching mask design of a detector unit within a polarization-sensitive focal plane array having both an A and B-type C-QWIP elements. One element has the grooves aligned along [01$\bar{1}$] and the other along [011]. Each detector element is 40×40 μm². The numbers as indicated in the detecting A and B elements are dimensions in microns. After chemical etching to a depth of 2.8 μm, the corrugations with desirable dimensions are formed due to finite undercut of the pattern from the etching process. A center island of an un-etched area is used for indium bump bonding use. FIG. 11b shows a polarization-sensitive array 200B having 5×10 detector units using individual units as shown in FIG. 11a, incorporated therein. Common connections to the bottom contact layer are located at the peripheral region of the mask. The resolution of an array however can be any n×m units, where n and m are integers.

FIGS. 11a and 11b are exemplary of the arrangements for detectors A and B, in which A and B are placed in alternate columns. There are other arrangements in which to form this checkerbroad. For example the first row and the subsequent odd rows of the array are in ABABAB-type of element arrangement. The second row and subsequent even rows can have elements in a BABABA-type element arrangement.

APPLICATIONS OF THE INVENTION

The various forms of the embodiments of the invention can provide a polarization-sensitive (PS) infrared photodetector array that can be designed for use in various applications such as cameras and infrared based instruments for detection of a target object based on the polarization properties of the radiation emitted or reflected by that object. The intensity of the radiation emitted from the object depends on the temperature and the emissivity of the object. When the intensity contrast of the objects in a scene is either very small or very large, infrared detection becomes difficult. A landmine buried under the soil is hard to detect since the temperature at the surface of the soil is uniform. In the other extreme, the scene surrounding an explosion appears to be black and unobservable because of the finite contrast range of a display. Polarization-sensitive (PS) infrared detection is primarily based upon the contrast in the polarization of the radiation. When light emitted or reflected from a surface is partially polarized, a polarization-sensitive (PS) infrared instrument such as a camera or navigational instrument can provide more information of a scene. As a first example, the invention can provide effective landmine detection, wherein a metallic landmine emits partially polarized light at a grazing angle. After the radiation penetrates through the soil, it retains part of the polarization information, thus a land mine can be detected by using a PS camera.

Another example is missile interceptor applications. During missile launching, infrared radiation from the plume of the rocket is much more intense compared to radiation from the rocket body. Generally, heat sensing interceptors home on the plume, thus frequently missing the rocket body. Considering that heat emitted by the plume is un-polarized, whereas heat reflected from the rocket body is partially polarized, infrared detection based on the polarization properties enables effective targeting of the rocket body instead of the plume. These two examples illustrate the usefulness of PS detection when the intensity contrast of the scene is either very high or very low. Commercial application of the invention includes fire-fighting use. In a burning building, intense fire and smoke occurs where a fireman generally cannot see passages in building using ordinary infrared cameras since fire flames dominates the scene. However, infrared reflection from a burning wall is polarized, hence can be viewed by a PS camera without interference from the flame. Another non-military use of the invention is for paint inspection. PS cameras are sensitive to the surface treatment of a material. A painted surface and a bare surface have high polarization contrast. The PS camera is useful in spotting bare areas in structures such as ships, bridges and pipes, thereby alerting personnel the need for corrosion prevention. Additionally, a PS camera is useful in many types of coating inspections for quality control in manufacturing processes. It is also useful in monitoring the icing conditions on bridges, roadways and airplanes for traffic safety.

Figure 12:
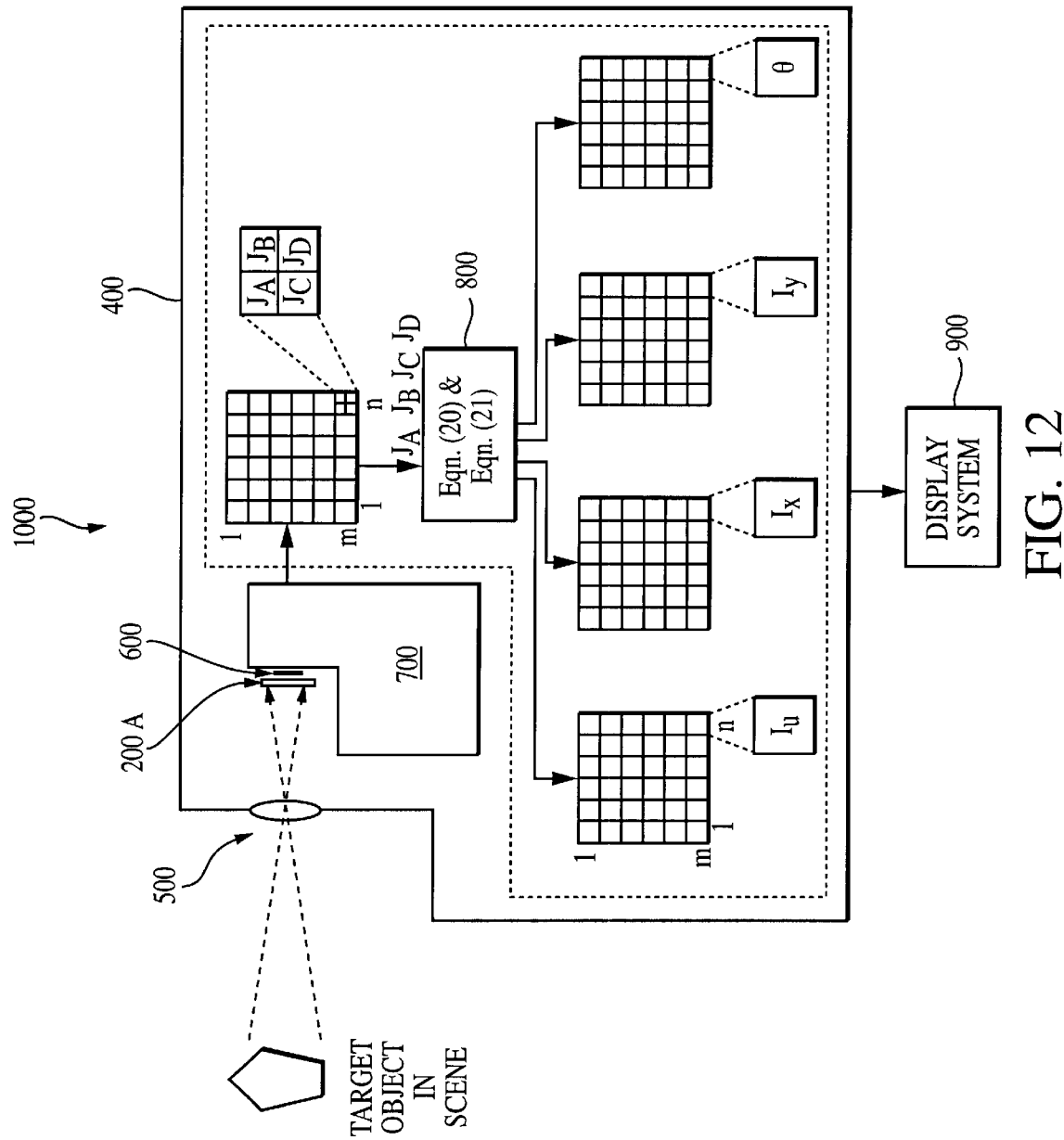
FIG. 12 shows an exemplary block diagram of an integrated polarization-sensitive infrared camera.

Referring now to FIG. 12, a block form of an exemplary polarization-sensitive camera 1000 is shown. The camera comprises a camera housing 400, focusing lens 500, a polarization-sensitive C-QWIP focal plane array (FPA) 200A, electronic readout circuit boards 600, a cryocooler 700, a microprocessor 800, and an image display subsystem 900. The focusing lens 500 projects an observed object image within a scene onto the focused plane array 200 that can incorporate either an array 200A or 200B. The electronic readout circuit 600 measures the photocurrent from the detector elements A, B, C and D of each detector unit simultaneously within the integration time. The microprocessor 800 transforms the photocurrent from the four detector elements in each detector unit (cell) 100A into the four polarization components according to Eqns. (20) and (21). Each polarization component from each cell can then be displayed separately or selectively on a screen to form a visual image of that component emitted from the scene. The image is updated at each frame time to create a motion picture of the scene.

The camera housing 400, the focusing lens 500, the electronic readout circuit boards, the cryocooler 700 and the image display subsystem 900 are commercially available as an IR camara system that can incorporate either embodiment of the invention. Commercially available IR camara systems include, but are not limited to: a) a ThermaCam SC3000™ made by FLIR Systems, Inc. in North Billercia, Mass., b) a Merlin™-Long QWIP made by Indigo Systems, Inc., in Santa Barbara, Calif., and c) and QWIP and CMT FPA Detectors made by AEG INFRAROT-MODULE, GmbH in Heilbronn, Germany.

The microprocessor 800 can be a computer integrated in the camera or be a separate unit not part of the housed camera. When using the second array embodiment of the invention, the camera construction is the same except that each detector unit 100B contains two detector elements, for example A and B, and the quantities displayed are proportional to $J_A$, $J_B$ or $J_A/J_B$.

Other applications of the invention include, but are not limited to IR sensing instruments in which the invention can be used include navigational instruments for aircraft that include polarization-sensitive detection capability. Light emitted from a runway landing area exhibits polarized light characteristics compared to its surrounding, which can be used for aircraft landing instruments during inclement weather such as fog. Maritime use of the invention include instruments that incorporate capabilities of recognizing differences between ocean and sky in an image for proper determination of an orientation of the instrument. Other applications of the invention include 3-D cameras having automatic recognition capability wherein the instrument has multiple view capability so as to provide enhanced 3-D perspective of an observed scene by determining the polarized sensitive aspects of a scene.

It will be readily apparent to one of ordinary skill in the art that the present invention fulfills the objectives set forth above. After reading the foregoing specification, those skilled in the art will be able to effect various modifications, changes, substitutions of equivalents and other aspects of the invention as broadly disclosed herein. It is therefore intended that the protection granted hereon be limited only by the scope of the invention as set forth in the appended claims and equivalents thereof.

What is claimed is:

1. A polarization-sensitive infrared photodetector array, the array comprising:
   a transparent semiconductor substrate having a planar surface;
   a first contact layer formed on the planar surface;
   at least two non-aligned corrugated quantum well infrared photodetector elements (C-QWIPs)formed on the first contact layer, each element being non-aligned with respect to each other, each C-QWIP having a stack of alternate planar barrier layers and planar well layers with the planes of the barrier layers and the well layers being substantially parallel to the planar surface, the stack having a polarization contrast detecting means formed therein such that the detecting means has at least one cavity that extends through the stack to the first contact layer, wherein the cavity detects a polarization state of incident infrared directed toward the well layers at different angles with respect to the planes of the well layers;
   a second contact layer formed on each of the quantum well infrared photodetector; and
   a metal plate deposited on the second contact layer.

2. The array of claim 1 wherein the polarization contrast detecting means includes at least one single-slit detection unit formed in the stack of each element.

3. The array of claim 2 wherein each the single-slit detection unit includes a cavity extending through the barrier layers, the well layers and the second contact layer of each element, and the at least two (C-QWIPs) elements are formed in pairs wherein the single slit detection unit in each element in the pair are orthogonal.

4. The array of claim 2 wherein each the single-slit detection unit includes a cavity extending through the barrier layers, the well layers and the second contact layer of each element, and the at least two (C-QWIPs) elements are formed in pairs wherein the single slit detection unit in each element in the pair are non-orthogonal.

5. The array of claim 3 further including a metal contact deposited on the first contact layer of each element.

6. The array of claim 5 wherein the cavity of at least one of the C-QWIPs includes opposed side walls having a V-shaped cross section and the at least one other of the C-QWIPs has a substantially inverted V-shaped notched cross section.

7. The array of claim 3 further including a solid insulator material positioned in the cavity and a metal surface mounted on the insulator material and covering the cavity, and wherein the refractive index of the insulator material is less than the refractive index of the stack.

8. The array of claim 6 comprises multiple cells in a rectangular n×m grid, wherein the quantity of the at least two C-QWIPs is two, n and m are integers, and each cell has similar structural form.

9. The array of claim 6 comprises multiple cells in a rectangular n×m grid pattern, wherein the quantity of the at least two C-QWIPs is two, n and m are integers, and each cell in within at least a second and subsequent even rows has inverted structural form of the two elements.

10. The array of claim 6 wherein the array comprises at least four non-aligned C-QWIPs formed on the first contact layer and forming at least one cell, the cavity of the other two C-QWIPS have an elongated rectangular cross section in a plane parallel to the plane of the well layers and side walls that extend substantially perpendicular to the plane of the well layers.

11. The array of claim 10 further including a solid insulator material positioned in the cavity and a metal surface mounted on the insulator material and covering the cavity, and wherein the refractive index of the insulator material is less than the refractive index of the stack.

12. The array of claim 10 comprises multiple cells in a rectangular grid pattern, wherein each cell has similar form.

13. The array of claim 2 wherein the at least one cavity in each element is multiple, each cavity in each element being arranged in parallel rows to form a grid.

14. The array of claim 1 wherein the polarization contrast detecting means includes structural corrugated grooves of each detector element relative to the crystallographic axes of materials forming each of the detector elements, whereby incident light can be reflected, refracted and diffracted within the cavity and preselected quantities $I_u$, $I_x$ and $I_y$ and $\theta$ observed from an observed scene provide contrast data in unpolarized intensity of the component $I_u$, contrast in intensity of horizontal polarization of the component $I_x$, contrast in intensity of vertical polarization of the component $I_y$, and contrast in orientation of the angle $\theta$.

15. A polarization-sensitive infrared photodetector array comprising:

a transparent semiconductor substrate having a planar surface;

at least two non-aligned corrugated quantum well infrared photodetector elements (C-QWIPs) optically coupled to the substrate, each element being non-aligned with respect to each other, each C-QWIP having a stack of alternate planar barrier layers and planar well layers;

the stack having a detection means formed therein such that the detection means for detecting polarization of incident infrared has at least one cavity that extends through the stack, wherein the cavity absorbs and reflects incident infrared radiation into a continuum of radiation components directed toward the well layers; and means to electrically bias each of the elements forming the corrugated quantum well infrared photodetector.

16. A polarization-sensitive infrared camera comprising:

a focusing lens;

a polarization sensitive corrugated quantum well infrared photodetector (C-QWIP) array disposed at the focal plane of the focusing lens;

circuit means for biasing, conditioning, and readout of photocurrent signals from the array;

a microprocessor coupled to the circuit means; and an output image display means coupled to the microprocessor.

17. The camera according to claim 16, wherein the array comprises:

a transparent semiconductor substrate having a planar surface;

at least two non-aligned corrugated quantum well infrared photodetector elements (C-QWIPs) optically coupled to the substrate, each element being non-aligned with respect to each other, each C-QWIP having a stack of alternate planar barrier layers and planar well layers;

the stack having a detection means formed therein such that the detection means for detecting contrast polarization of incident infrared radiation, the detection means has at least one cavity that extends through the stack, wherein the cavity reflects, refracts and diffracts incident infrared radiation into a continuum of radiation components directed toward the well layers; and means to electrically bias each of the elements by the circuit means.

18. The array of claim 17 wherein the array comprises at least four non-aligned C-QWIPs optically coupled on the substrate thereby forming at least one cell, a first pair of C-QWIPS including the cavity structures wherein at least one of the C-QWIPs includes opposed side walls having a V-shaped cross section and the at least one other of the C-QWIPs has a substantially inverted V-shaped notched cross section; and a second pair of C-QWIPS wherein the cavity of the second pair of C-QWIPS have an elongated rectangular cross section in a plane parallel to the plane of the well layers and side walls that extend substantially perpendicular to the plane of the well layers.

19. The array of claim 17 comprises multiple cells in a rectangular n×m grid, wherein n and m are integers, and each cell has similar form.

20. The camera according to claim 16, wherein the microprocessor includes means to process measured photocurrent signals from cells within the array, whereby incident light can be reflected, refracted and diffracted within the cavity and preselected quantities $I_u$, $I_x$ and $I_y$ and $\theta$ observed from an observed scene provide contrast data in unpolarized intensity of the component $I_u$, contrast in intensity of horizontal polarization of the component $I_x$, contrast in intensity of vertical polarization of the component $I_y$, and contrast in orientation of the angle $\theta$.

* * * * *